(12) United States Patent
Nakashima et al.

(10) Patent No.: US 8,779,830 B2
(45) Date of Patent: Jul. 15, 2014

(54) INVERSE LEVEL SHIFT CIRCUIT

(71) Applicants: Takaki Nakashima, Fukuoka (JP); Motoki Imanishi, Fukuoka (JP); Kenji Sakai, Fukuoka (JP)

(72) Inventors: Takaki Nakashima, Fukuoka (JP); Motoki Imanishi, Fukuoka (JP); Kenji Sakai, Fukuoka (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 13/802,576

(22) Filed: Mar. 13, 2013

(65) Prior Publication Data

US 2014/0062571 A1 Mar. 6, 2014

(30) Foreign Application Priority Data

Aug. 31, 2012 (JP) ................................ 2012-191906

(51) Int. Cl.
*H03L 5/00* (2006.01)

(52) U.S. Cl.
USPC ................. 327/333; 326/80; 326/81

(58) Field of Classification Search
USPC ...................... 327/333; 326/80, 81
See application file for complete search history.

(56) References Cited

U.S. PATENT DOCUMENTS

| 6,664,822 | B2 * | 12/2003 | Watabe .......................... 327/108 |
| 6,774,674 | B2 * | 8/2004 | Okamoto et al. ............... 326/80 |
| 7,595,667 | B2 * | 9/2009 | Liang ............................. 327/108 |
| 8,558,585 | B2 * | 10/2013 | Ishimatsu ..................... 327/108 |
| 2003/0012040 | A1 | 1/2003 | Orita et al. |

FOREIGN PATENT DOCUMENTS

JP 2003-032102 A 1/2003

* cited by examiner

*Primary Examiner* — Kenneth B. Wells
(74) *Attorney, Agent, or Firm* — Studebaker & Brackett PC

(57) ABSTRACT

A voltage conversion mask signal generation circuit generates a first main signal and a first mask signal by converting an output signal of the first transistor to a low-side voltage, and generating a second main signal and a second mask signal by converting an output signal of the second transistor to a low-side voltage. A mask signal generation circuit generating a third mask signal with higher sensitivity than the first and second mask signals with respect to a fluctuation in the high-side reference potential. A mask logical circuit generating a fourth mask signal by performing a AND operation between the first mask signal and the second mask signal, and masking the first and second main signals with the third and fourth mask signals; and a SR flip flop circuit generating the output signal from the masked first and second main signals.

12 Claims, 6 Drawing Sheets

INVERSE LEVEL SHIFT CIRCUIT

BACKGROUND OF THE INVENTION

1. Field of the Invention

The present invention relates to an inverse level shift circuit capable of realizing a stable inverse level shift operation in response to a fluctuation in a high-side reference potential caused by ON/OFF switching of a power switching element.

2. Background Art

In power semiconductor devices that switch ON/OFF a power switching element, an inverse level shift circuit is used which converts a high-side (P side) signal to a low-side (N side) signal (e.g., see Japanese Patent Laid-Open No. 2003-32102). The inverse level shift circuit drives a transistor using ON/OFF pulse signals generated from the high-side input signal and converts those signals to low-side voltages using a resistor. An SR flip flop circuit generates an output signal from the ON/OFF pulse signals converted to the low-side voltages.

SUMMARY OF THE INVENTION

A VS potential (high-side reference potential) fluctuates between a P potential and an N potential at the time of ON/OFF switching of the power switching element. Currents flowing through the transistors on the ON side and the OFF side become unbalanced at the time of a fluctuation in the VS potential (dV/dt transient period), producing a difference between mask signals on the ON side and the OFF side. In this case, in conventional circuits, the mask period is determined by one of the mask signals, whichever is shorter, resulting in a problem that an error signal is outputted when the difference is longer than the mask period. Furthermore, since the inverse level shift circuit transmits a signal irrespective of whether the VS potential is a P potential or an N potential, resulting in a problem that high currents flow through the transistors to thereby destroy the inverse level shift circuit when the P potential is applied. Thus, it is not possible to perform a stable inverse level shift operation in response to a fluctuation in the VS potential.

In view of the above-described problems, an object of the present invention is to provide an inverse level shift circuit capable of realizing a stable inverse level shift operation in response to a fluctuation in a high-side reference potential.

According to the present invention, An inverse level shift circuit that converts a high-side input signal to a low-side output signal, includes: a first pulse circuit outputting a first pulse signal on a rise of the input signal; a second pulse circuit outputting a second pulse signal on a fall of the input signal; first and second drive circuits generating first and second drive signals from the first and second pulse signals using a high-side reference potential as a reference potential; first and second transistors driven by the first and second drive signals respectively; a voltage conversion mask signal generation circuit generating a first main signal and a first mask signal by converting an output signal of the first transistor to a low-side voltage, and generating a second main signal and a second mask signal by converting an output signal of the second transistor to a low-side voltage; a mask signal generation circuit generating a third mask signal with higher sensitivity than the first and second mask signals with respect to a fluctuation in the high-side reference potential; a mask logical circuit generating a fourth mask signal by performing a AND operation between the first mask signal and the second mask signal, and masking the first and second main signals with the third and fourth mask signals; and a SR flip flop circuit generating the output signal from the masked first and second main signals.

The present invention makes it possible to realize a stable inverse level shift operation in response to a fluctuation in a high-side reference potential.

Other and further objects, features and advantages of the invention will appear more fully from the following description.

DETAILED DESCRIPTION OF THE PREFERRED EMBODIMENTS

An inverse level shift circuit according to the embodiments of the present invention will be described with reference to the drawings. The same components will be denoted by the same symbols, and the repeated description thereof may be omitted.

First Embodiment

Figure 1:
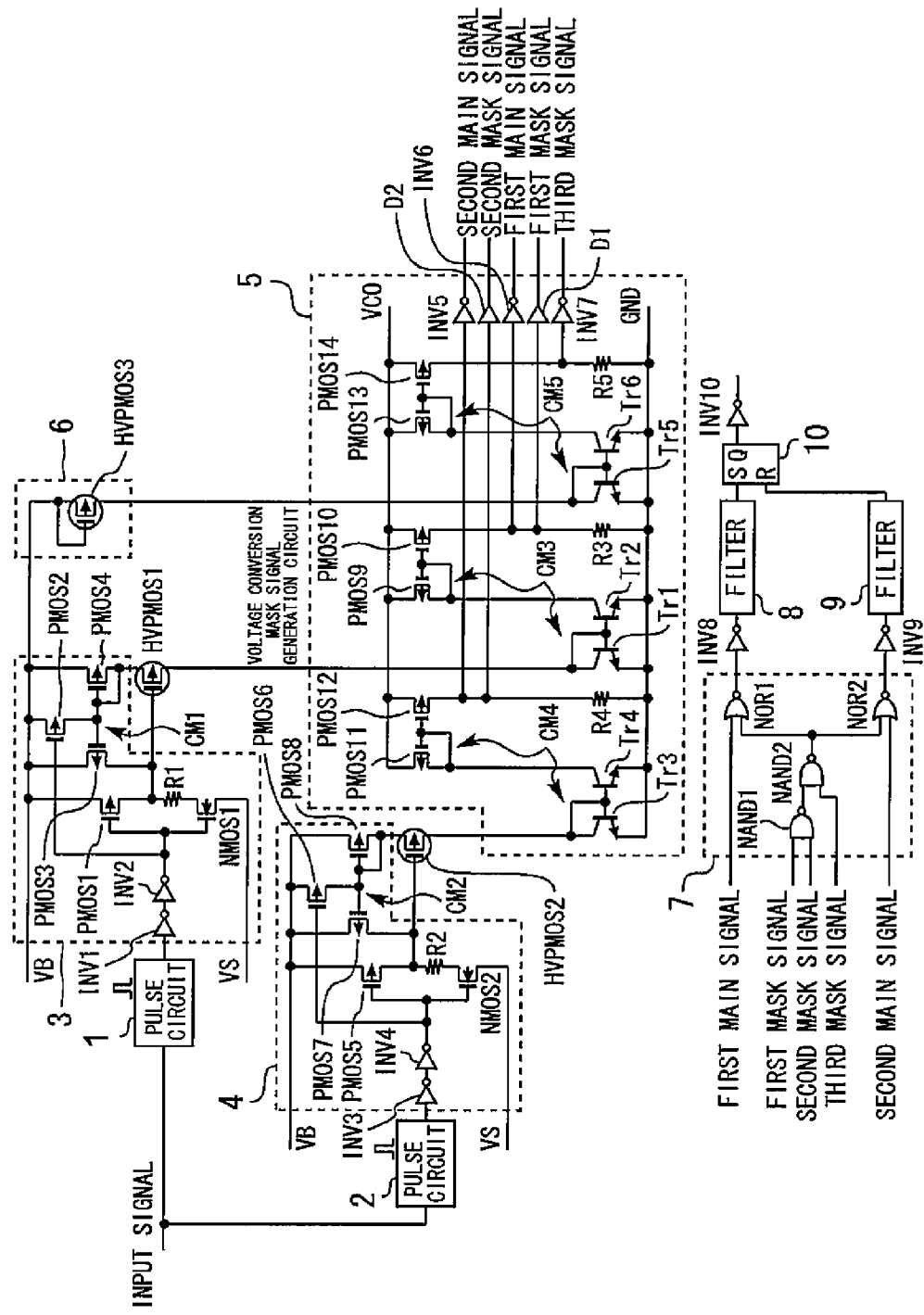
FIG. 1 is a diagram illustrating an inverse level shift circuit according to a first embodiment of the present invention.

FIG. 1 is a diagram illustrating an inverse level shift circuit according to a first embodiment of the present invention. This circuit is an inverse level shift circuit that converts a high-side input signal to a low-side output signal, and is used for a power semiconductor device that switches ON/OFF a power switching element or the like.

A pulse circuit 1 outputs a first one-shot pulse signal on the rise of an input signal. A pulse circuit 2 outputs a second one-shot pulse signal on the fall of the input signal. Drive circuits 3 and 4 generate first and second drive signals from the first and second pulse signals using a VB potential as a power supply and a VS potential as a reference potential.

The drive circuit 3 includes inverters INV 1 and INV 2, transistors PMOS 1 to PMOS 4, an NMOS 1 and a resistor R1 (reference character PMOS denotes a PMOS transistor, reference character NMOS denotes an NMOS transistor, and the same applies hereinafter). The PMOS 1 and the NMOS 1 constitute an inverter and the PMOS 3 and the PMOS 4 constitute a current mirror circuit CM 1. Similarly, the drive circuit 4 includes inverters INV 3 and INV 4, and transistors PMOS 5 to PMOS 8, an NMOS 2 and a resistor R2. The PMOS 5 and NMOS 2 constitute an inverter and the PMOS 7 and PMOS 8 constitute a current mirror circuit CM 2.

Transistors HVPMOS 1 and HVPMOS 2 are driven by first and second drive signals respectively. The HVPMOS 1 and HVPMOS 2 are HVPMOS (high voltage p-type metal oxide semiconductor) transistors.

Using a VCC potential as a power supply and GND as a reference potential, a voltage conversion mask signal generation circuit 5 converts an output signal of the HVPMOS 1 to a low-side voltage, generates a first main signal and a first mask signal, converts an output signal of the HVPMOS 2 to a low-side voltage and generates a second main signal and a second mask signal.

The voltage conversion mask signal generation circuit 5 includes transistors Tr1 to Tr6, PMOS 9 to PMOS 14, resistors R3 to R5, inverters INV 5 to INV 7, and diodes D1 and D2. The Tr1 to Tr6 are bipolar transistors. The Tr1, Tr2, PMOS 9 and PMOS 10 constitute a current mirror circuit CM3, the Tr3, Tr4, and PMOS 11 and 12 constitute a current mirror circuit CM 4, and the Tr5, Tr6, PMOS 13 and PMOS 14 constitute a current mirror circuit CM 5. The current mirror circuits CM 3 and CM 4 cause currents of the output signals of the HVPMOS 1 and HVPMOS 2 to attenuate respectively.

A mask signal generation circuit 6 monitors a fluctuation in the VS potential using a diode-connected transistor HVPMOS 3. The HVPMOS 3 is always used in an OFF state and generates a third mask signal using a displacement current that flows through a source-drain parasitic capacitance when the VS potential fluctuates. In this case, the third mask signal is generated with higher sensitivity than the first and second mask signals with respect to the fluctuation in the VS potential. Although the HVPMOS 3 is connected to the VB potential, since a constant voltage is applied to VB-VS, the VS potential can be monitored.

A mask logical circuit 7 includes a NAND circuit NAND 1, a NAND 2, and NOR circuits NOR 1 and NOR 2. This mask logical circuit 7 ANDs the first mask signal and the second mask signal to generate a fourth mask signal (corresponding to the output of the NAND 1), and the first and second main signals are masked with both the third mask signal and the fourth mask signal.

The masked first and second main signals are inputted to filter circuits 8 and 9 via inverters INV 8 and INV 9 respectively. The filter circuits 8 and 9 filter the masked first and second main signals to remove noise respectively.

The outputs of the filter circuits 8 and 9 are inputted to an S terminal and an R terminal of an SR flip flop circuit 10 respectively. The SR flip flop circuit 10 generates an output signal from the masked first and second main signals. An output signal from a Q terminal of the SR flip flop circuit 10 is outputted via an INV 10.

Figure 2:
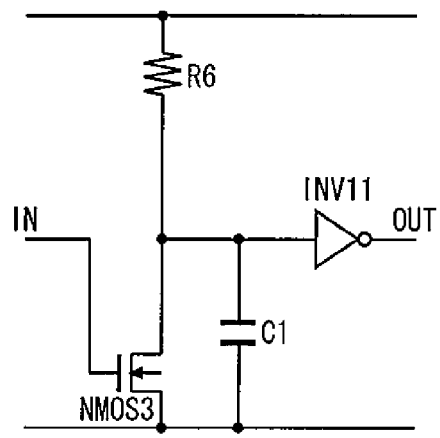
FIG. 2 is a diagram illustrating a filter circuit according to the first embodiment of the present invention.

FIG. 2 is a diagram illustrating a filter circuit according to the first embodiment of the present invention. This circuit corresponds to the filter circuit 8 or 9 in FIG. 1. The filter circuit 8 or 9 includes a resistor R6, a transistor NMOS 3, a capacitor C1 and an inverter INV 11. The resistor R6 is a constant current source. A filter time can be arbitrarily set by adjusting the resistor value of this resistor R6. Furthermore, the circuit can be simplified by configuring the constant current source using the resistor R6.

Figure 3:
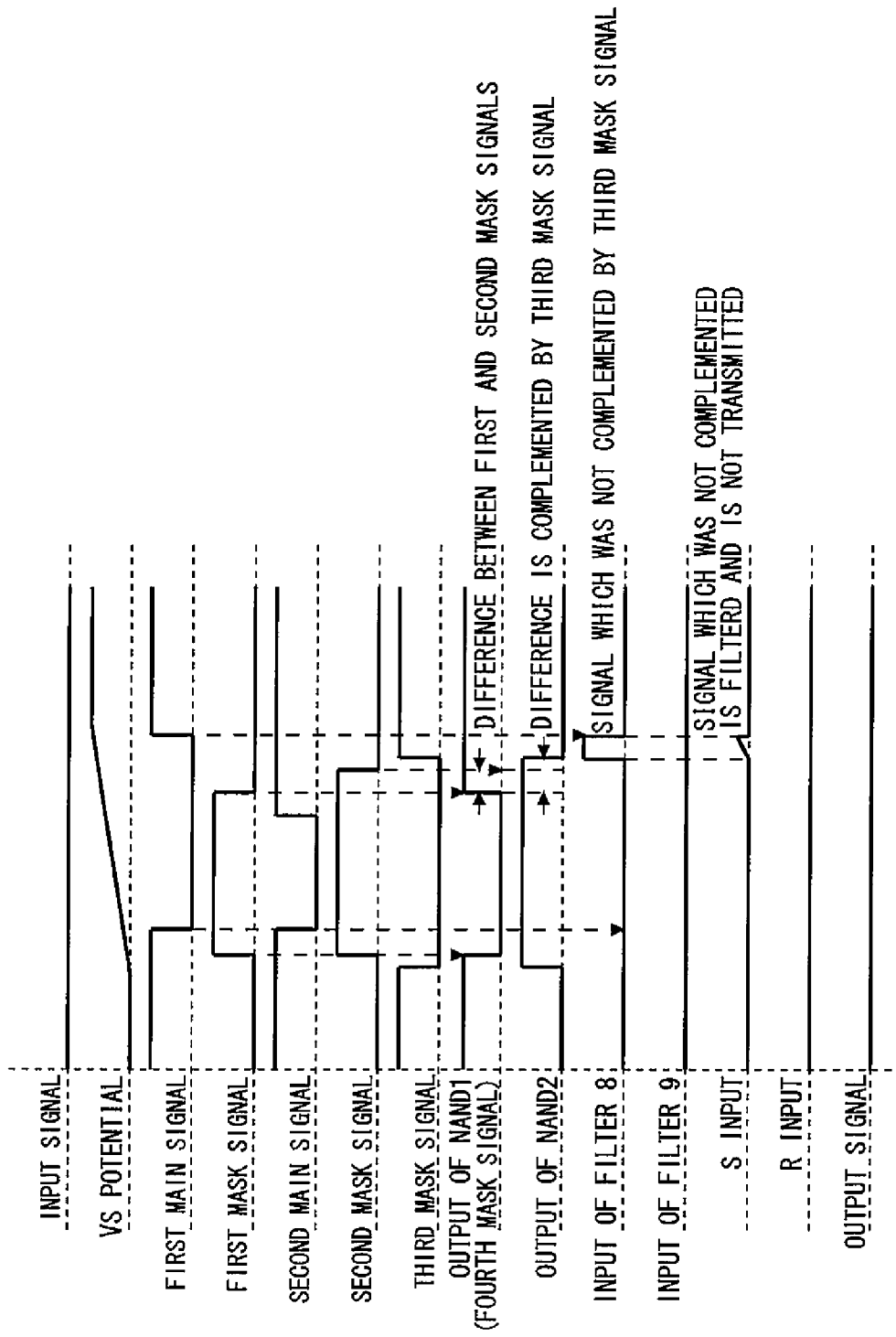
FIG. 3 is a timing chart of the inverse level shift circuit according to the first embodiment of the present invention.

FIG. 3 is a timing chart of the inverse level shift circuit according to the first embodiment of the present invention. When the VS potential fluctuates, currents flowing through the HVPMOS 1 and the HVPMOS 2 on the ON side and the OFF side become unbalanced, producing a difference between the first and second mask signals. In this case, since the conventional circuit performs masking using only the fourth mask signal (corresponding to the output of the NAND 1) obtained by ANDing the first mask signal and the second mask signal, if the difference therebetween is longer than the mask period, an error signal is outputted.

In contrast, the present embodiment generates a third mask signal with higher sensitivity than the first and second mask signals in response to a fluctuation in the VS potential. The width of this third mask signal is greater than the width of the first and second mask signals generated due to the fluctuation in the VS potential. The first and second main signals are masked with both the third mask signal and the fourth mask signal. This makes it possible to complement the difference between the first and second mask signals and prevent an error signal from being outputted. As a result, it is possible to realize a stable inverse level shift operation in response to a fluctuation in the VS potential (high-side reference potential).

Furthermore, by causing the filter circuits 8 and 9 to filter the masked first and second main signals, it is possible to complement the difference between the first and second mask signals that could not be complemented by the third mask signal and prevent an error signal from being outputted.

Furthermore, the current mirror circuits CM 1 and CM 2 of the drive circuits 3 and 4 limit currents flowing through the HVPMOS 1 and HVPMOS 2 respectively during operation. This prevents the HVPMOS 1 and HVPMOS 2 from being destroyed even when the VS potential is a P potential. Moreover, the current mirror circuit CM 1 equalizes a circuit load connected to source terminal of the HVPMOS 1 and a circuit load connected to input terminal of the HVPMOS 1, and the current mirror circuit CM 2 equalizes a circuit load connected to source terminal of the HVPMOS 2 and a circuit load connected to input terminal of the HVPMOS 2. When the VS potential fluctuates, this can equalize noise levels and frequencies or the like applied thereto. For this reason, it is possible to stabilize the gate-source voltage and prevent erroneous ON. Furthermore, it is also possible to prevent instantaneous application of a voltage equal to or higher than a gate withstand voltage, causing destruction.

Furthermore, since the current mirror circuits CM 3 and CM 4 in the voltage conversion mask signal generation circuit 5 cause currents of output signals in the HVPMOS 1 and the HVPMOS 2 to attenuate, thus making it possible to reduce sensitivity with respect to a displacement current and prevent an error signal from being outputted.

Second Embodiment

Figure 4:
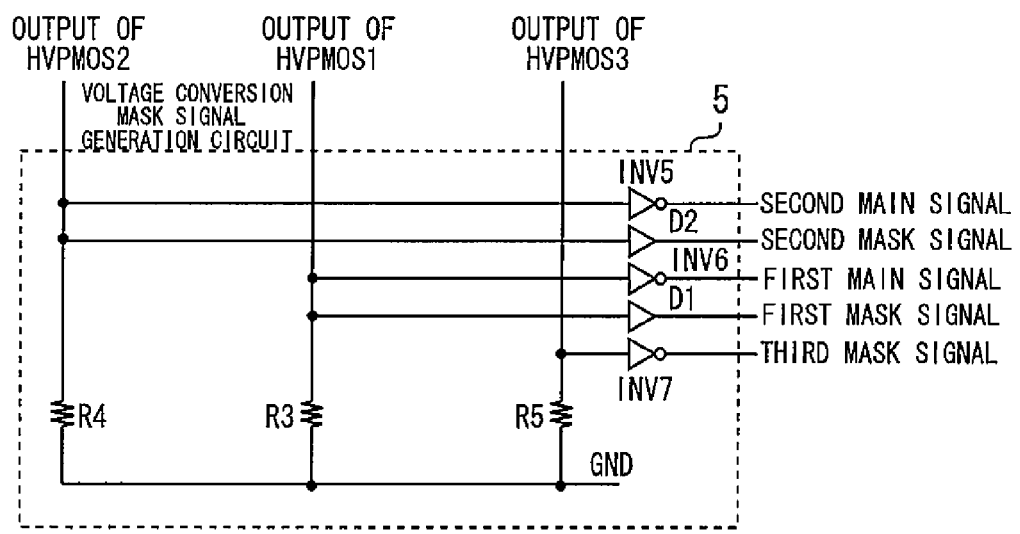
FIG. 4 is a diagram illustrating a voltage conversion mask signal generation circuit according to a second embodiment of the present invention.

FIG. 4 is a diagram illustrating a voltage conversion mask signal generation circuit according to a second embodiment of the present invention. In the present embodiment, output signals of the HVPMOS 1 and the HVPMOS 2 are converted to low-side voltages only through the resistors R3 and R4 respectively. This allows the circuit to be simplified compared to the first embodiment. The other components and effects are similar to those of the first embodiment.

Third Embodiment

Figure 5:
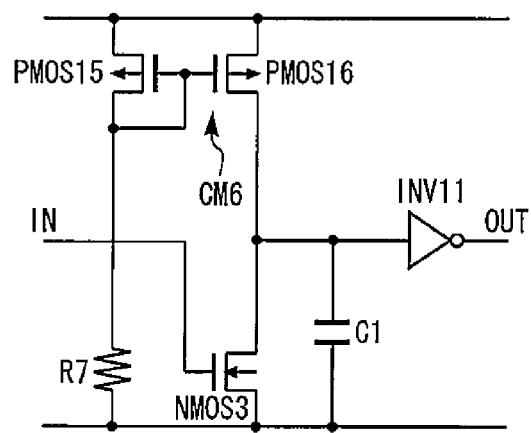
FIG. 5 is a diagram illustrating a filter circuit according to a third embodiment of the present invention.

FIG. 5 is a diagram illustrating a filter circuit according to a third embodiment of the present invention. The filter circuit 8 or 9 includes a resistor R7 and transistors PMOS 15 and PMOS 16 as a constant current source. The PMOS 15 and the PMOS 16 constitute a current mirror circuit CM 6. A filter time can be arbitrarily set by adjusting a current ratio of the current mirror circuit CM 6. The other components and effects are similar to those of the first and second embodiments.

Fourth Embodiment

Figure 6:
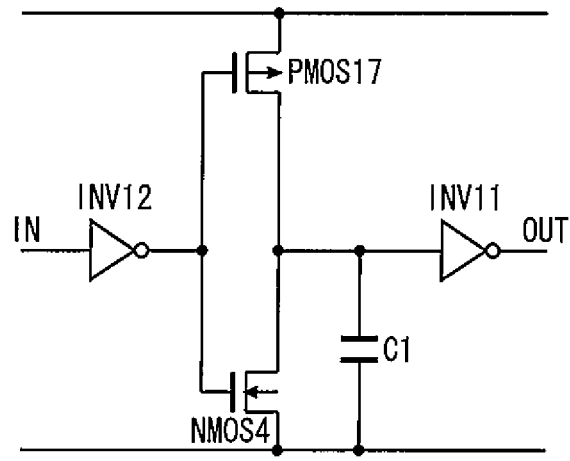
FIG. 6 is a diagram illustrating a filter circuit according to a fourth embodiment of the present invention.

FIG. 6 is a diagram illustrating a filter circuit according to a fourth embodiment of the present invention. The filter circuit 8 or 9 has an inverter INV 12 and transistors PMOS 17 and NMOS 4. An inverter using these PMOS 17 and NMOS 4 constitutes a constant current source. This allows the circuit to be simplified. The other components and effects are similar to those of the first and second embodiments.

Fifth Embodiment

Figure 7:
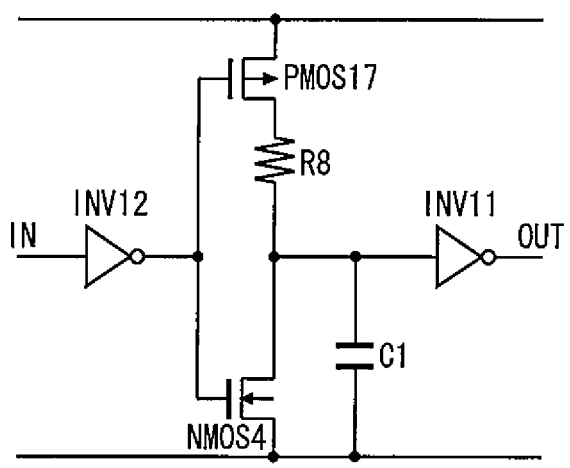
FIG. 7 is a diagram illustrating a filter circuit according to a fifth embodiment of the present invention.

FIG. 7 is a diagram illustrating a filter circuit according to a fifth embodiment of the present invention. In the filter circuit 8 or 9, a resistor R8 is connected to the output of an inverter using a PMOS 17 and an NMOS 4. A current of the constant current source can be arbitrarily set by adjusting the resistance value of this resistor R8. The other components and effects are similar to those of the fourth embodiment.

Sixth Embodiment

Figure 8:
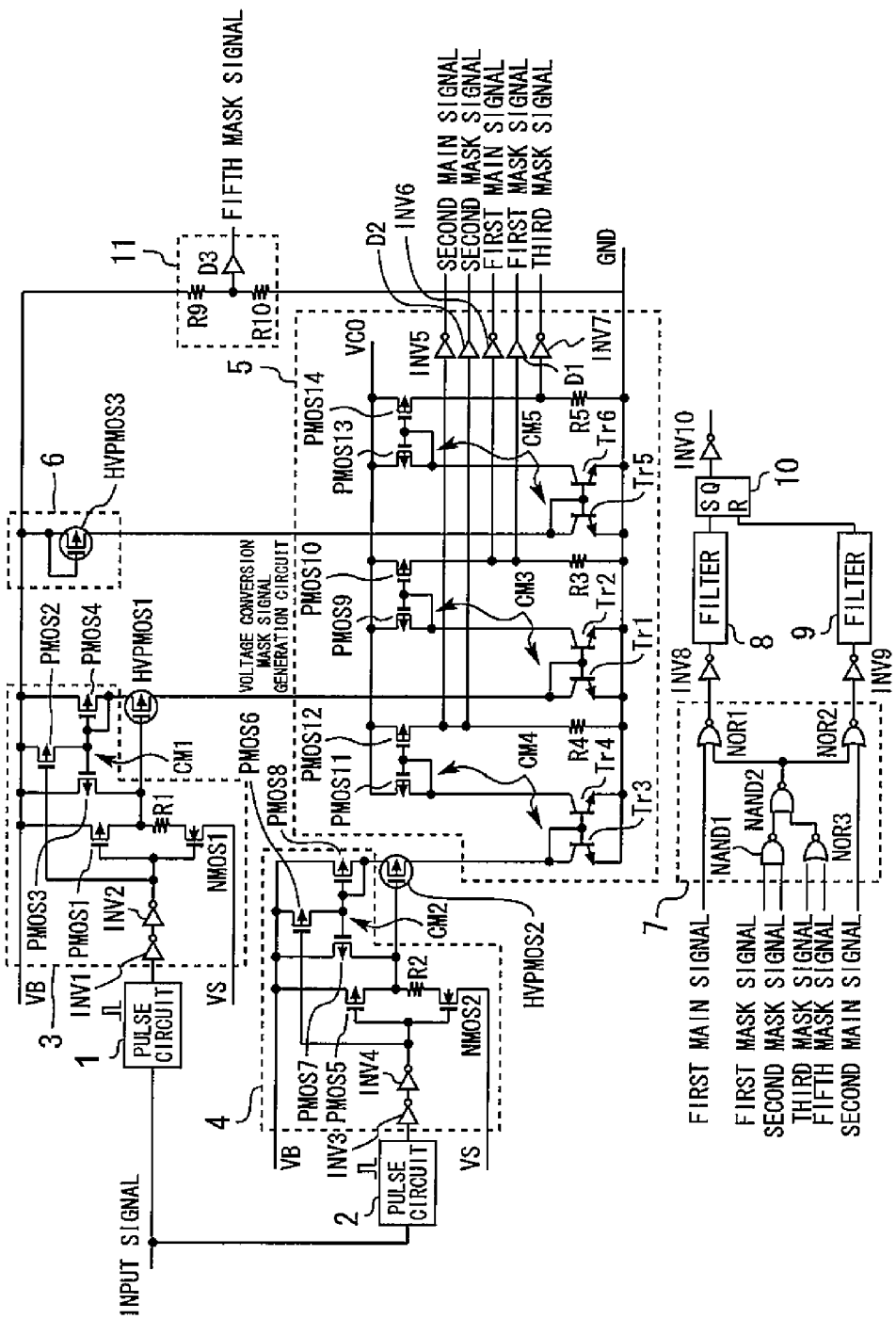
FIG. 8 is a diagram illustrating an inverse level shift circuit according to a sixth embodiment of the present invention.

FIG. 8 is a diagram illustrating an inverse level shift circuit according to a sixth embodiment of the present invention. A mask signal generation circuit 11 monitors a fluctuation in a high-side reference potential through resistance division of resistors R9 and R10. A fifth mask signal is generated through a diode D3. The mask logical circuit 7 is further provided with a NOR circuit NOR 3 that performs a NOR operation between the third mask signal and the fifth mask signal, and masks the first and second main signals with the third, fourth and fifth mask signals. A threshold of the VS potential that outputs a mask signal can be arbitrarily set by adjusting resistance values of the resistors R9 and R10. The other components and effects are similar to those of the first to fifth embodiments.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2012-191906, filed on Aug. 31, 2012 including specification, claims, drawings and summary, on which the Convention priority of the present application is based, are incorporated herein by reference in its entirety.

What is claimed is:

1. An inverse level shift circuit that converts a high-side input signal to a low-side output signal, comprising:
 a first pulse circuit outputting a first pulse signal on a rise of the input signal;
 a second pulse circuit outputting a second pulse signal on a fall of the input signal;
 first and second drive circuits generating first and second drive signals from the first and second pulse signals using a high-side reference potential as a reference potential;
 first and second transistors driven by the first and second drive signals respectively;
 a voltage conversion mask signal generation circuit generating a first main signal and a first mask signal by converting an output signal of the first transistor to a low-side voltage, and generating a second main signal and a second mask signal by converting an output signal of the second transistor to a low-side voltage;
 a mask signal generation circuit generating a third mask signal with higher sensitivity than the first and second mask signals with respect to a fluctuation in the high-side reference potential;
 a mask logical circuit generating a fourth mask signal by performing a AND operation between the first mask signal and the second mask signal, and masking the first and second main signals with the third and fourth mask signals; and
 a SR flip flop circuit generating the output signal from the masked first and second main signals.

2. The inverse level shift circuit according to claim 1, wherein the first and second drive circuits include current mirror circuits which limit currents flowing through the first and second transistors respectively during operation.

3. The inverse level shift circuit according to claim 2, wherein the current mirror circuit of the first drive circuit equalizes a circuit load connected to a source terminal of the first transistor and a circuit load connected to an input terminal of the first transistor, and
 the current mirror circuit of the second drive circuit equalizes a circuit load connected to a source terminal of the second transistor and a circuit load connected to an input terminal of the second transistor.

4. The inverse level shift circuit according to claim 1, wherein the voltage conversion mask signal generation circuit includes a current mirror circuit causing currents of output signals of the first and second transistors to attenuate.

5. The inverse level shift circuit according to claim 1, wherein the voltage conversion mask signal generation circuit includes a resistor converting output signals of the first and second transistors to low-side voltages.

6. The inverse level shift circuit according to claim 1, further comprising first and second filter circuits filtering the masked first and second main signals.

7. The inverse level shift circuit according to claim 6, wherein each of the first and second filter circuits includes a resistor as a constant current source.

8. The inverse level shift circuit according to claim 6, wherein each of the first and second filter circuits includes a resistor and a current mirror circuit as a constant current source.

9. The inverse level shift circuit according to claim 6, wherein each of the first and second filter circuits includes an inverter formed of a transistor as a constant current source.

10. The inverse level shift circuit according to claim 9, wherein each of the first and second filter circuits further includes a resistor connected to an output of the inverter.

11. The inverse level shift circuit according to claim 1, wherein the mask signal generation circuit monitors a fluctuation in the high-side reference potential using a diode-connected transistor.

12. The inverse level shift circuit according to claim 1, wherein the mask signal generation circuit monitors a fluctuation in the high-side reference potential through resistance division.

* * * * *